United States Patent [19]

Stut

[11] 4,107,448
[45] Aug. 15, 1978

[54] METHOD AND DEVICE FOR CRUCIBLE-FREE FLOATING ZONE MELTING

[75] Inventor: Hans Stut, Gröbenzell, Germany

[73] Assignee: Siemens Aktiengesellschaft, Berlin and Munich, Germany

[21] Appl. No.: 704,639

[22] Filed: Jul. 12, 1976

Related U.S. Application Data

[63] Continuation of Ser. No. 579,026, May 19, 1975, abandoned, which is a continuation of Ser. No. 186,618, Oct. 5, 1971, abandoned.

[30] Foreign Application Priority Data

Oct. 15, 1970 [DE] Fed. Rep. of Germany ....... 2050076

[51] Int. Cl.² ............................................. B01J 17/08
[52] U.S. Cl. ................................... 13/26; 13/DIG. 1
[58] Field of Search ................. 13/DIG. 1, 1, 26, 27; 219/10.75, 10.77

[56] References Cited

U.S. PATENT DOCUMENTS 3,270,177   8/1966   Prediger et al. ................ 13/DIG. 1

Primary Examiner—R. N. Envall, Jr.
Attorney, Agent, or Firm—Herbert L. Lerner

[57] ABSTRACT

By coupling the molten zone of a semiconductor rod, which is subjected to a crucible-free zone melting operation, to the operating coil used for inductively heating the molten zone, the frequency of the generator energizing the coil is determined. At constant geometry, this frequency is a measure of the molten zone volume and can be used for control purposes. A high-frequency cable disposed between the generator and the operating coil is fully matched, so that substantially only effective power has to be transmitted.

4 Claims, 1 Drawing Figure

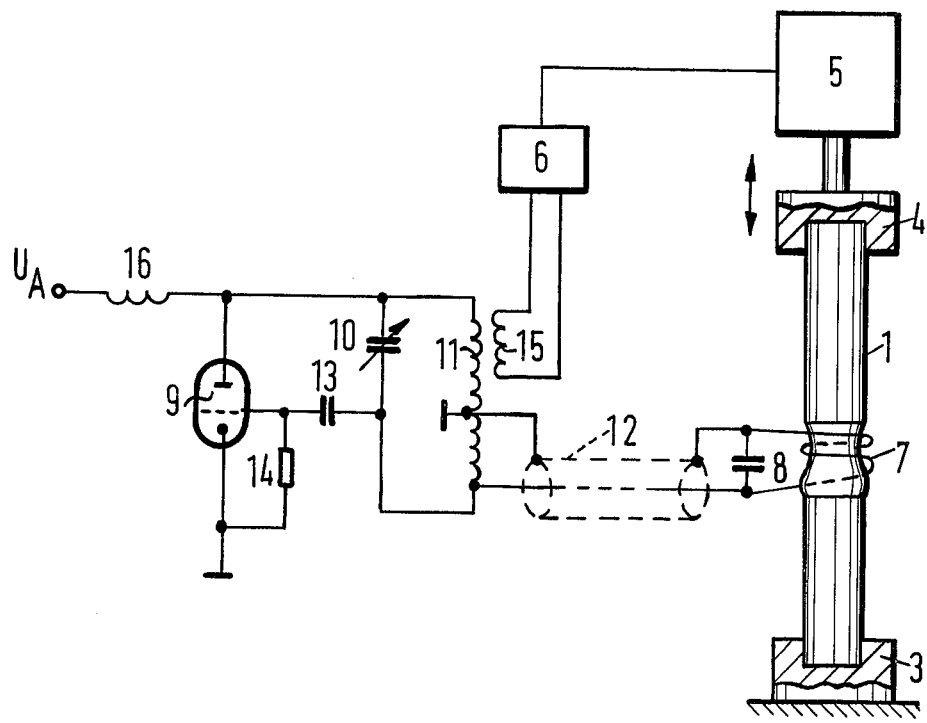

METHOD AND DEVICE FOR CRUCIBLE-FREE FLOATING ZONE MELTING

This is a continuation of application Ser. No. 579,026, filed May 19, 1975, which is a continuation of Ser. No. 186,618, filed Oct, 5, 1971, both abandoned.

The invention relates to a method of crucible-free zone melting a rod of semiconductor base material, particularly silicon which is supported at its ends and in which the volume of melt in the melting zone, which is inductively heated by a heating coil, is controlled by varying the distance between the two rod holders, the heating coil being connected to a high-frequency generator through a high-frequency cable.

Such a method and associated device are known and are, for instance, described in German Pat. No. 1,153,908. The actual technical method of zone melting involves moving a heating coil, which surrounds a semiconductor rod in longitudinal direction of the rod. The semiconductor material melts in the vicinity of the heating coil due to inductive heating. Through the movement of the heating coil and the concomitant shifting of the molten zone with the subsequent solidification of the semiconductor material, a transformation of the rod from polycrystalline to noncrystalline material is achieved and, furthermore, a purification of the material is effected since impurities travel with the melting zone along the rod. Also, the movement of the heating coil, and the molten zone, accordingly have an effect upon the rod diameter.

The deciding factors having an effect upon the rod diameter are mainly the size of the molten zone volume and the shape thereof. To exert an influence on the rod diameter, one may control the supply of high-frequency energy on the one hand, and on the other hand, control the distance between the two holders of the rod and thereby stretch or compress the volume of the molten zone.

From the aforementioned German patent, it is known to control the spacing of the two rod holders by means of a suitable mechanism for the purpose of producing a monocrystalline semiconductor rod of defined thickness, i.e. constant within a desired range. The size of the molten zone volume serves as criterion for this control. This molten zone volume is inductively coupled with the heating coil and influences the inductance of the latter. The heating coil, together with a capacitor, constitutes a circuit secondary to a primary circuit which is in the high-frequency generator. Between the primary circuit and the secondary circuit, there is disposed a high-frequency cable which transmits the heating power. Both circuits are detuned with respect to each other, i.e. the operating point lies on the rising flank of the transmission curve of the entire system. Through a change in the self-inductance of the heating coil, this detuning changes, which manifests itself in a change in the loading of the generator tube and therefore in a change of the anode or plate current. Since a given thickness of the solidifying semiconductor rod, in this way, corresponds to a specific magnitude of the plate or anode current, the magnitude of the plate current is used as criterion for the control. Thereby, a control loop is closed, the control quantity of which is the molten volume or the rod diameter, respectively, the positioning quantity is the distance between the holders, and the measured quantity, the plate current of the generator tube.

It is a disadvantage of these known methods that the high-frequency cable must transmit a relatively large reactive current component.

It is an object of the present invention not only to eliminate this shortcoming but also provide method for crucible-free zone melting and the associated device for a control mechanism therefore which is much simplified over heretofore known methods and devices of this general type.

With the foregoing and other objects in view, there is provided, in accordance with the invention, method of crucible-free zone melting a rod of semiconductor material supported by holders at opposite ends thereof which comprises inductively heating by a heating coil connected through a high-frequency cable with a high-frequency generator, a molten zone formed in the rod, varying the spacing between the rod end holders so as to control the volume of the molten zone, and varying the volume of the molten zone so as to vary inductive coupling of the heating coil and the molten zone and thereby adjust the effective inductance of the heating coil to fix the frequency of the frequency generator energizing the heating coil, the frequency serving as a criterion for the control, and the high-frequency cable being fully matched during operation.

Further in accordance with the invention, there is provided device for carrying out the method of crucible-free zone melting of a rod of semiconductor material supported by holders at opposite ends thereof comprising a heating coil for inductively heating a molten zone formed in the rod, a high-frequency generator, and a high-frequency cable interconnects the high-frequency generator and the heating coil for energizing the coil, the high-frequency cable being fully matched during operation of the device, means responsive to a signal for varying the spacing between the rod end holders so as to control the volume of the molten zone, the molten zone and the heating coil being inductively coupled, the inductive coupling thereof being variable with variation in the volume of the molten zone and means for adjusting the effective inductance of the heating coil to fix the frequency of the frequency generator and the heating coil being in the form of a structural unit so that the high-frequency calbe is of minimum length.

The great advantage over the above-mentioned state of the art is that in order to form a criterion for a deviation of the molten zone volume from a theoretical volume, a deviation from a previously existing detuning of two circuits is no longer necessary, which leads to a considerable loading of the high-frequency cable with reactive power. In the method according to the invention, a simple frequency measurement suffices, and forms a deviation from a reference frequency as criterion for the deviation of volume. In this connection the high-frequency cable is tuned for the reference frequency in such a manner that it only has to transmit active power. This results not only in lower cable loading but also in an increase in the operational reliability of the high-frequency generator.

Other features which are considered as characteristic for the invention are set forth in the appended claims.

Although the invention is illustrated and described herein as method and device for crucible-free floating zone melting, it is nevertheless not intended to be limited to the details shown, since various modification may be made therein without departing from the spirit of the invention and within the scope and range of equivalents of the claims.

The invention, however, together with additional objects and advantages thereof will be best understood from the following description when read in connection with the single FIGURE of the drawing showing a circuit diagram of the device for carrying out the method of crucible-free zone melting in accordance with the invention.

Referring now to the drawing, there is shown therein a semiconductor rod 1 clamped at both of its ends in two holders 3 and 4. The holder 4 is mechanically connected to a mechanism 5 which can move the holder 4 relative to the holder 3 in opposite directions. The mechanism 5 is actuated by a signal supplied by a conventional control 6. The rod 1 is surrounded at its melting zone by a heating coil 7, connected in parallel with a capacitor 8.

Heating energy is supplied by a high-frequency generator formed, in a conventional manner, by a tube 9 having an anode, grid and cathode and by a tank circuit at the output of the tube 9 having a feedback to the input thereof. The tank circuit is made up of a coil 11 and a variable capacitor 10 connected in parallel therewith. The heating coil 7 is connected through a high-frequency cable 12. Preferably a coaxial cable, in parallel to a part of the coil 11. The outer conductor of the coaxial cable 12 and, thereby, a tap of the coil 11 are connected to ground. One of the junctions of the capacitor 10 with the coil 11 is connected to the plate of the tube 9, the other junction to the inner conductor of the high-frequency or coaxial cable 12 and, through a capacitor 13, to the grid of the tube 9. A resistor 14 is connected between the grid and the cathode of the tube 9. The plate is supplied with a plate voltage $U_A$ through a coil 16. The cathode is at ground potential. A coil 15 leading to the input of the control 6 is inductively coupled to the coil 11.

The high-frequency generator the heating coil 7 and the high-frequency cable 12 mutually connecting them constitute a high frequency oscillating circuit of the invention which oscillates at a frequency determined by the magnitude of its reactances. Part of the inductance is supplied by the high-frequency coil 7, the self-inductance of which, as aforedescribed, depends upon the volume of the molten zone surrounded by it. Thus, the particular volume of the molten zone exerts an influence upon the frequency of the high-frequency generator. This frequency is measured by the coil 15 and is fed to the control 6 for control purposes. The control 6 accordingly produces a control signal, in a conventional manner, for the mechanism 5 which can stretch or compress the volume of the molten zone by respectively increasing or decreasing the spacing between the two rod end holders 3 and 4 and thereby restores the frequency to a pre-set reference value which corresponds to a desired volume of the molten zone. The high-frequency cable 12 is operated matched to the greatest extent and is therefore subjected to no unnecessary loading. The energy fed to the molten zone is controllable by varying the anode or plate voltage $U_A$. The inductance of the heating coil 7 is adjusted or accommodated to the requirements of the high-frequency generator of the invention by the capacitor 8 of the illustrated embodiment. This can also be effected by utilizing the electrical length of the high-frequency cable 12 for transforming the inductance of the heating coil 7. A further advantageous embodiment of the invention is to provide a high-frequency generator which is simultaneously movable together with the heating coil 7, i.e. by being constructed as an integral unit therewith. The length of the high-frequency cable would accordingly be virtually zero. Thus, the high frequency generator would have to be supplied in that case only with DC power through a flexible cable which would be movable with the integrated structural unit of the high-frequency generator and heating coil 7.

I claim:

1. Method of automatically controlling crucible-free zone melting of a rod of semiconductor material supported by holders at opposite ends thereof which comprises heating a molten zone in the rod by an inductive heater which, together with a high frequency generator component and a high frequency cable fully matched during the heating operation and connecting the inductive heater to the high frequency generator component, forms a high frequency oscillating circuit and adjusting the spacing between the rod end holders so as to control the volume of the molten zone in response to the oscillating frequency of the high-frequency oscillating circuit, the oscillating frequency of which is determined by the combined inductivity of the high-frequency generator component and the inductive heater, the latter being inductively coupled to the molten zone of the rod, the inductive coupling thereof and the inductivity of the inductive heater being variable with varying volume of the molten zone so that the oscillating frequency of the high frequency oscillating circuit is dependent upon the volume of the molten zone and serves as a control criterion.

2. Device for carrying out a method of automatically controlling crucible-free zone melting of a rod of semiconductor material supported by holders at opposite ends thereof, comprising a high frequency oscillating circuit including therein a high-frequency generator component, an inductive heater component for heating a molten zone formed in the rod, and a high-frequency cable fully matched during operation of the device and connecting said inductive heater component to said high-frequency generator component, said high-frequency oscillating circuit oscillating with a frequency determined by the combined inductivity of said high-frequency generator component and said inductive heater component, said inductive heater component being inductively coupled to the molten zone of the rod, the inductive coupling thereof and the inductivity of said inductive heater being variable with varying volume of the molten zone whereby the oscillating frequency of the high-frequency oscillating circuit is dependent upon the volume of the molten zone, and means responsive to the oscillating frequency of the high-frequency oscillating circuit for adjusting the distance between the rod end holders so as to adjust the volume of the molten zone to a given value at which the high-frequency oscillating circuit oscillates at a predetermined frequency serving as a control criterion.

3. Device according to claim 1 including a capacitance connected in parallel with said heating coil component for varying the effective inductance of said heating coil component.

4. Device according to claim 2 wherein said high-frequency cable has a given length for transforming the inductivity of said inductive heater in said high-frequency oscillating circuit.

* * * * *